United States Patent
Hartung et al.

(10) Patent No.: US 11,740,565 B2
(45) Date of Patent: Aug. 29, 2023

(54) COLLECTOR FLOW RING

(71) Applicant: ASML Netherlands B.V., Veldhoven (NL)

(72) Inventors: Taylor John Hartung, San Diego, CA (US); Yue Ma, Escondido, CA (US); Marc Guy Langlois, Rancho Mirage, CA (US); Jeremy Burke, San Diego, CA (US); Esteban Joseph Sandoval Johnson, Chula Vista, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/784,951

(22) PCT Filed: Dec. 9, 2020

(86) PCT No.: PCT/EP2020/085146
§ 371 (c)(1),
(2) Date: Jun. 13, 2022

(87) PCT Pub. No.: WO2021/130017
PCT Pub. Date: Jul. 1, 2021

(65) Prior Publication Data
US 2023/0010251 A1   Jan. 12, 2023

Related U.S. Application Data

(60) Provisional application No. 62/970,497, filed on Feb. 5, 2020, provisional application No. 62/953,067, filed on Dec. 23, 2019.

(51) Int. Cl.
*G03F 7/20*     (2006.01)
*G03F 7/00*     (2006.01)

(52) U.S. Cl.
CPC ...... *G03F 7/70916* (2013.01); *G03F 7/70033* (2013.01); *G03F 7/7085* (2013.01); *G03F 7/70808* (2013.01)

(58) Field of Classification Search
CPC ............. G03F 7/70033; G03F 7/70916; G03F 7/70908–70941; G03F 7/7085;
(Continued)

(56) References Cited

U.S. PATENT DOCUMENTS

| 7,511,799 B2 | 3/2009 | Tel et al. |
| 2014/0126043 A1* | 5/2014 | Senekerimyan ....... H05G 2/008 359/361 |

(Continued)

FOREIGN PATENT DOCUMENTS

| WO | 2018127565 A2 | 7/2018 |
| WO | 2019158492 A1 | 8/2019 |

OTHER PUBLICATIONS

Guillaume Roesch, European International Searching Authority, International Search Report and Written Opinion, counterpart PCT Application No. PCT/EP2020/085146, dated Mar. 29, 2021, 11 pages total.

(Continued)

*Primary Examiner* — Christina A Riddle
(74) *Attorney, Agent, or Firm* — DiBerardino McGovern IP Group LLC

(57) ABSTRACT

Systems, apparatuses, and methods are provided for a collector flow ring (CFR) housing configured to mitigate an accumulation of fuel debris in an extreme ultraviolet (EUV) radiation system. An example CFR housing can include a plurality of showerhead flow channel outlets configured to output a plurality of first gaseous fluid flows over a plurality of portions of a plasma-facing surface of the CFR housing. The example CFR housing can further include a gutter purge (Continued)

flow channel outlet configured to output a second gaseous fluid flow over a fuel debris-receiving surface of the CFR housing. The example CFR housing can further include a shroud mounting structure configured to support a shroud assembly, a cooling flow channel configured to transport a fluid, and a plurality of optical metrology ports configured to receive a plurality of optical metrology tubes.

20 Claims, 10 Drawing Sheets

(58) Field of Classification Search
CPC .. G03F 7/70858; G03F 7/708; G03F 7/70808; G03F 7/70975; G03F 7/70991; H05G 2/00–008
USPC .................. 355/18, 30, 52–55, 67–77, 133; 250/492.1, 492.2, 492.22, 492.23, 493.1, 250/504 R, 505.1, 515.1; 378/34, 119
See application file for complete search history.

(56) References Cited

U.S. PATENT DOCUMENTS

| | | | |
|---|---|---|---|
| 2014/0216576 A1 | 8/2014 | Someya et al. | |
| 2014/0217311 A1* | 8/2014 | Nishisaka | H05G 2/008 250/504 R |
| 2014/0306115 A1* | 10/2014 | Kuritsyn | G02B 27/0006 250/503.1 |
| 2015/0282287 A1* | 10/2015 | De Dea | G03F 7/70 134/1.1 |
| 2016/0128171 A1* | 5/2016 | Kuritsyn | G03F 7/70916 250/504 R |
| 2016/0143122 A1* | 5/2016 | Heo | H05G 2/005 239/524 |
| 2017/0215265 A1* | 7/2017 | Baek | H05G 2/008 |
| 2019/0033225 A1* | 1/2019 | Chang | G03F 7/70033 |
| 2019/0364654 A1* | 11/2019 | Ueda | H05G 2/008 |
| 2020/0137864 A1* | 4/2020 | Su | H05G 2/005 |
| 2021/0029811 A1* | 1/2021 | Kouge | G03F 7/70175 |
| 2021/0063899 A1* | 3/2021 | Xia | G03F 7/70175 |
| 2021/0109452 A1* | 4/2021 | Ma | G03F 7/70033 |

OTHER PUBLICATIONS

Anonymous author, "Semiconductor Processing Equipment," Research Disclosure, Kenneth Mason Publications, Hampshire, UK, GB, vol. 668, No. 54, Nov. 14, 2019, 5 pages total.

* cited by examiner

COLLECTOR FLOW RING

CROSS REFERENCE TO RELATED APPLICATIONS

This application claims priority to U.S. Application No. 62/953,067, filed Dec. 23, 2019 and titled COLLECTOR FLOW RING; and also claims priority to U.S. Application No. 62/970,497, filed Feb. 5, 2020 and titled COLLECTOR FLOW RING, both of which are incorporated herein in their entireties by reference.

TECHNICAL FIELD

The present disclosure relates to collectors and collector flow rings for extreme ultraviolet (EUV) radiation systems.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the scanning direction) while synchronously scanning the target portions parallel or anti-parallel, i.e. opposite to, this scanning direction. It is also possible to transfer the pattern from the patterning device to the substrate by imprinting the pattern onto the substrate.

Extreme ultraviolet (EUV) light, for example, electromagnetic radiation having wavelengths of around 50 nanometers (nm) or less (also sometimes referred to as soft x-rays), and including light at a wavelength of about 13 nm, can be used in or with a lithographic apparatus to produce extremely small features in or on substrates, for example, silicon wafers. Methods to produce EUV light include, but are not necessarily limited to, converting a material that has an element, for example, xenon (Xe), lithium (Li), or tin (Sn), with an emission line in the EUV range to a plasma state. For example, in one such method called laser produced plasma (LPP), the plasma can be produced by irradiating a target material, which is interchangeably referred to as fuel in the context of LPP sources, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

Inside a traditional tin-based radiation source vessel, many functions such as protective hydrogen (H2) gases, heat shielding, and precise shroud mounting must also allow for metrology field of view (FOV) and droplet path clearance while preventing tin accumulation. Currently, there are many separate modules used to address each of these issues individually. For example, an active heat shield absorbs unwanted heat flux, a perimeter flow ring and collector module provide for shroud mounting and perimeter H2 flow, and cut-outs within these modules allow for metrology FOV and deflect stray light. However, no hardware on this traditional radiation source vessel provides showerhead flow below the flow vanes. Further, there is no way to add either (i) a single module or (ii) modifications to current modules that would allow the addition of showerhead flow protection.

SUMMARY

The present disclosure describes various aspects of systems, apparatuses, and methods for manufacturing and using a collector flow ring (CFR) housing configured to mitigate an accumulation of fuel debris, remove heat, and provide for optical metrology and various other aspects in an extreme ultraviolet (EUV) radiation system.

In some aspects, the present disclosure describes a CFR housing configured to mitigate an accumulation of fuel debris in an EUV radiation system. The CFR housing can include a plurality of showerhead flow channel outlets configured to output a plurality of first gaseous fluid flows over a plurality of portions of a plasma-facing surface of the CFR housing. The CFR housing can further include a gutter purge flow channel outlet configured to output a second gaseous fluid flow over a fuel debris-receiving surface of the CFR housing. The CFR housing can further include a shroud mounting structure configured to support a shroud assembly. The CFR housing can further include a cooling flow channel configured to transport a fluid configured to remove heat from at least a portion of the CFR housing during an EUV radiation generation operation of the EUV radiation system. The CFR housing can further include a plurality of optical metrology ports configured to receive a plurality of optical metrology tubes.

In some aspects, the plurality of showerhead flow channel outlets, the gutter purge flow channel outlet, and the plurality of optical metrology ports are disposed in, i.e. formed in, a main body of the collector flow ring housing which may be a single piece of material.

In some aspects, the present disclosure describes an EUV radiation source. The EUV radiation source can include a laser source configured to generate optical pulses that are configured to illuminate a fuel material at an irradiation location at which the illuminated fuel material is configured to generate a plasma that is configured to emit EUV radiation. The EUV radiation source can further include a fuel source configured to deliver the fuel material to the irradiation location. The EUV radiation source can further include a CFR housing including a plurality of showerhead flow channel outlets configured to output a plurality of first gaseous fluid flows over a plurality of portions of a plasma-facing surface of the CFR housing. The CFR housing can further include a gutter purge flow channel outlet configured to output a second gaseous fluid flow over a fuel debris-receiving surface of the CFR housing. The CFR housing can further include a shroud mounting structure configured to support a shroud assembly. The CFR housing can further include a cooling flow channel configured to transport a liquid fluid configured to remove heat from at least a portion of the CFR housing during an EUV radiation generation operation of the EUV radiation system. The CFR housing can further include a plurality of optical metrology ports configured to receive a plurality of optical metrology tubes.

The EUV radiation source can further include a controller configured to generate a first control signal configured to instruct the laser source to generate the optical pulses. The controller can be further configured to generate a second control signal configured to instruct the fuel source to deliver the fuel material. The controller can be further configured to generate a third control signal configured to instruct a gaseous fluid source to control the output of the plurality of first gaseous fluid flows from the plurality of showerhead flow channel outlets. The third control signal can be further configured to instruct the gaseous fluid source to control the output of the second gaseous fluid flow from the gutter purge flow channel outlet. The controller can be further configured to generate a fourth control signal configured to instruct a liquid fluid source to control the transport of the liquid fluid in the cooling flow channel.

In some aspects, the present disclosure describes a method for manufacturing a CFR housing configured to mitigate an accumulation of fuel debris in an extreme ultraviolet (EUV) radiation system. The method can include forming a plurality of showerhead flow channel outlets configured to output a plurality of first gaseous fluid flows over a plurality of portions of a plasma-facing surface of the CFR housing. The method can further include forming a gutter purge flow channel outlet configured to output a second gaseous fluid flow over a fuel debris-receiving surface of the CFR housing. The method can further include forming a shroud mounting structure configured to support a shroud assembly. The method can further include forming a cooling flow channel configured to transport a fluid configured to remove heat from at least a portion of the CFR housing during an EUV radiation generation operation of the EUV radiation system. The method can further include forming a plurality of optical metrology ports configured to receive a plurality of optical metrology tubes.

Further features, as well as the structure and operation of various aspects, are described in detail below with reference to the accompanying drawings. It is noted that the disclosure is not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWING

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

Figure 1A:
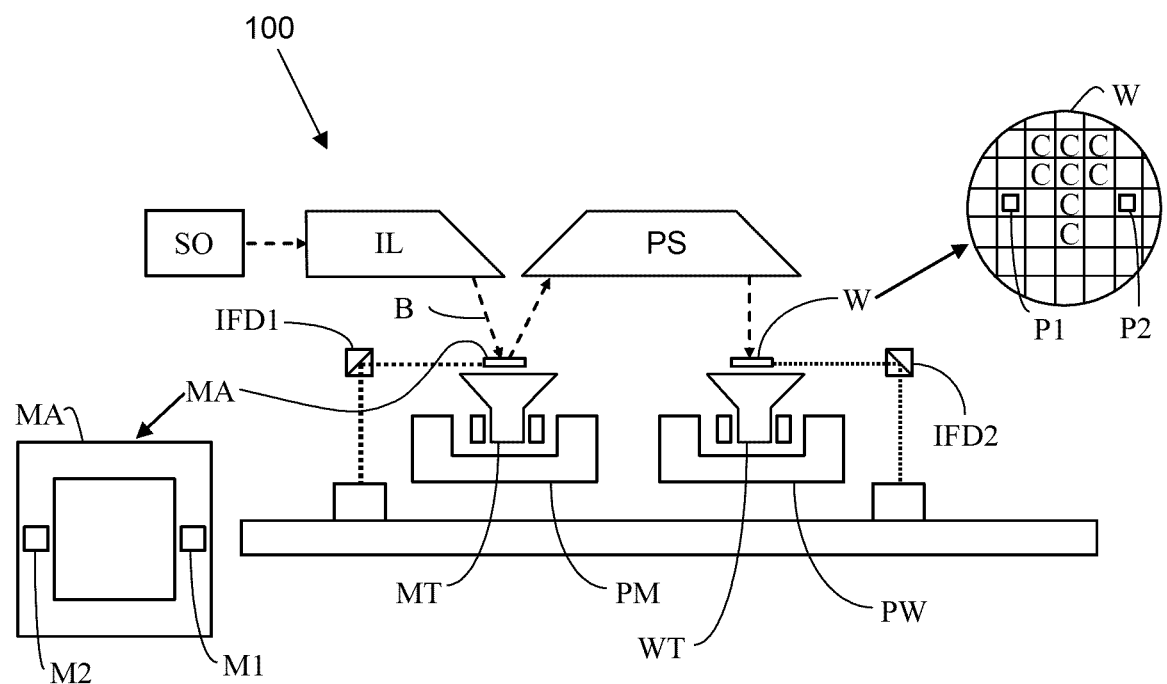
FIG. 1A is a schematic illustration of an example reflective lithographic apparatus according to some aspects of the present disclosure.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," "an exemplary embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Overview

In contrast to conventional radiation source vessels, the present disclosure provides for a radiation source vessel having a collector flow ring (CFR) that combines many individual modules into a single apparatus and in many cases, many features form part of a single machined piece, making the radiation source vessel modular. For example, the radiation source vessel disclosed herein moves the perimeter flow function from the radiation collector to the CFR, moves the shroud mounting function from the radiation collector to the CFR, adds a purge flow function to the CFR. Further, the radiation source vessel disclosed herein adds to the CFR a showerhead flow function to keep plasma facing surfaces clean and a purge flow function to keep tin from overflowing out the heated gutter below the flow vanes. In some aspects, by moving the perimeter flow ring off of the radiation collector and onto the CFR, and by combining these functions into a single apparatus, the radiation source vessel disclosed herein provides for improved serviceability and upgradeability and reduced hardware cost.

In some aspects, the CFR disclosed herein combines the functionality of heat shielding, shroud mounting, stray light deflection, passage for droplets, metrology FOV, gas protection of plasma facing surfaces, a flow directed at the gutter to prevent overflow, and other functions disclosed herein all into a single apparatus. In some aspects, the CFR disclosed herein provides an exhaust route for the metrology flow. In some aspects, the CFR disclosed herein reserves space for a removeable insert to clean off tin writing, referred to herein as a tin writing insert. In some aspects, the CFR disclosed herein can handle a higher power (e.g., 350 W) than the power in conventional radiation source vessels (e.g., 250 W). In some aspects, the CFR disclosed herein can have a serviceability of less than about two hours with a seven year lifetime. In some aspects, the CFR disclosed herein provides guiding for the radiation collector to avoid interference and position the radiation collector precisely.

In some aspects, the CFR disclosed herein combines the following functionality into a single assembly: perimeter flow ring geometry for split perimeter flow; showerhead flow added to plasma facing surfaces to keep surfaces clean from tin; gutter purge flow added to prevent tin overflow spillage from flow vanes gutter; supply showerhead and gutter flows and provide non-uniformity of less than about three percent; metrology FOV for multiple metrology ports (e.g., thirteen metrology ports); active cooling to sink heat away; shroud mounting; stray light deflection; placeholder for tin writing insert design (e.g., provides the ability to upgrade the tin writing insert); flexible seals contain metrology flow exhaust and can adapt to misalignment of CFR position; and precision-manufactured guide rails to give the radiation collector a path for install and an alignment within about 1 mm, 100 microns, about 10 microns, or about 1 micron.

In some aspects, the CFR disclosed herein combines the following features:

1. A single apparatus able to combine functionality of the above-mentioned modules and include the new functionality of showerhead flow, thereby combining thermal cooling, gas flows, and precision alignment into a single apparatus.

2. Showerhead flow: H2 flow protection (Peclet) of plasma facing surfaces to keep clean of tin.

3. Gutter purge flow: flow used to prevent tin flowing inside of flow vanes gutter from spilling over.

4. Shared plenum of showerhead and gutter flows: predictable and uniform flow outlet from a shared plenum and single inlet source of H2 by passive means.

5. Single apparatus design combining heat shield, precision mounting, collector guiding, flow delivery, droplet passage, and optical FOV passage.

6. Collector guiding: guide rails that steer the radiation collector along a safe path into the precisely positioned mounting location (e.g., within a tolerance of about 1 mm, 100 microns, about 10 microns, or about 1 micron).

7. Metrology flow seals: resistance seals able to close gap between interior radiation source vessel wall and metrology tubes in the CFR within the positional tolerance range of the CFR (e.g., within a tolerance of about 1 mm, 100 microns, about 10 microns, or about 1 micron).

8. Cooling water channel within $H_2$ plenum with a combined O-ring and gasket sealing structure that allows for the thermal path to be shorter than conventional designs.

9. Precision shroud mounting that self-centers. The shroud can be configured to protect the fuel targets (e.g., droplets).

10. Shrink-fit metrology tube sealing that uses the inserted metrology tubes to seal the breakthroughs that can occur due to boring operation to fit the tubes (e.g., shrink-fit tubing to seal flow between plenums).

11. Choked-restricted flow structure to delivery low non-uniformity with a single inlet and shared plenums.

12. Stray light scattering in metrology tubes with custom threading.

There are many advantages and benefits to the radiation source vessel and CFR disclosed herein. For example, the various aspects of the present disclosure provide for: modularity (e.g., improved serviceability, improved upgradeability); improved performance (e.g., more functions included in a single apparatus); improved availability (e.g., less tin deposition and faster serviceability than conventional radiation source vessels); and reduced cost (e.g., building the perimeter flow function into the CFR can be cheaper than building the perimeter flow function into the radiation collector as in conventional designs).

Before describing such aspects in more detail, however, it is instructive to present an example environment in which aspects of the present disclosure can be implemented.

Example Lithographic Systems

Figure 1B:
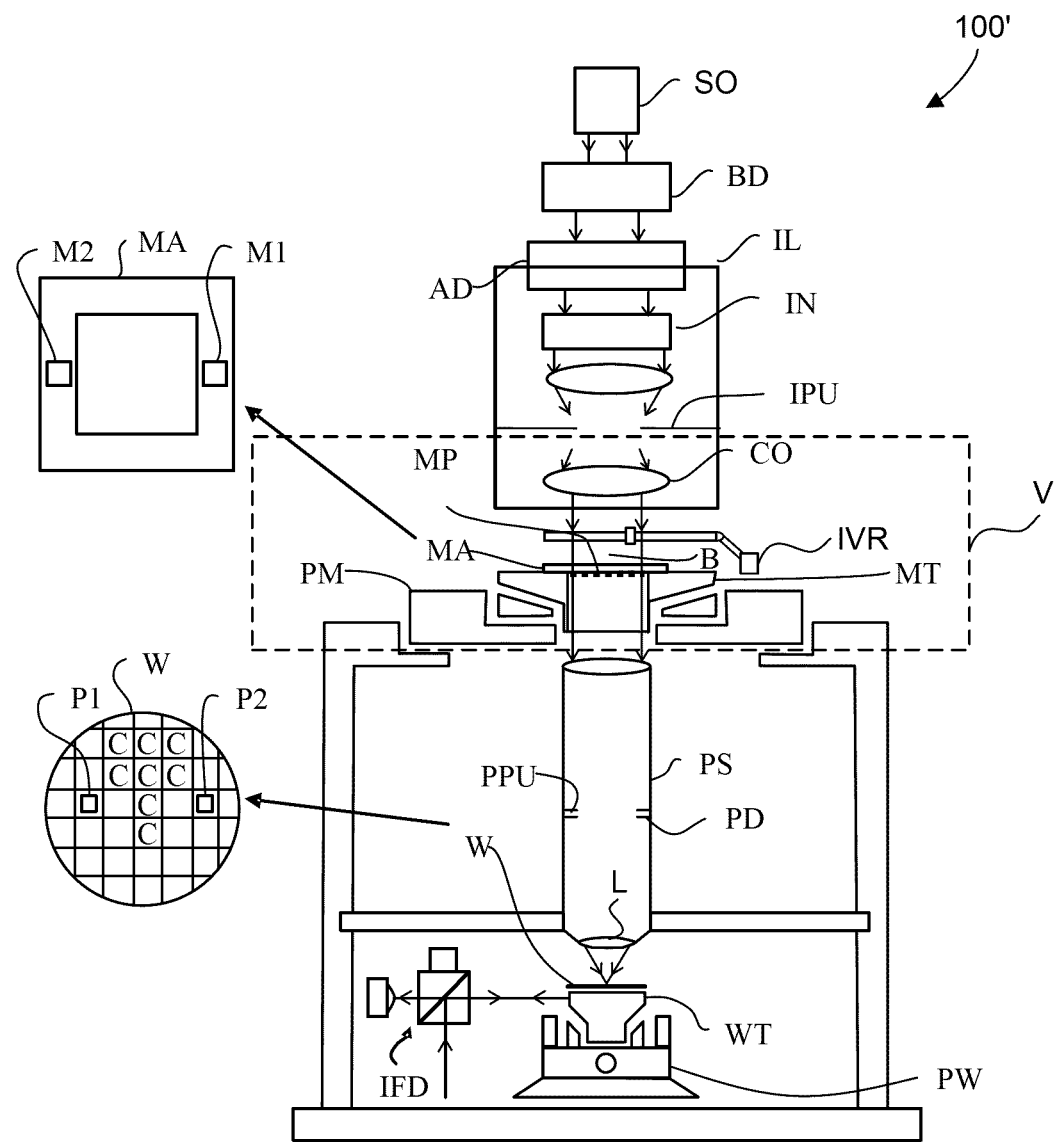
FIG. 1B is a schematic illustration of an example transmissive lithographic apparatus according to some aspects of the present disclosure.

FIGS. 1A and 1B are schematic illustrations of a lithographic apparatus 100 and lithographic apparatus 100', respectively, in which aspects of the present disclosure can be implemented. As shown in FIGS. 1A and 1B, the lithographic apparatuses 100 and 100' are illustrated from a point of view (e.g., a side view) that is normal to the XZ plane (e.g., the X-axis points to the right and the Z-axis points upward), while the patterning device MA and the substrate W are presented from additional points of view (e.g., a top view) that are normal to the XY plane (e.g., the X-axis points to the right and the Y-axis points upward).

Lithographic apparatus 100 and lithographic apparatus 100' each include the following: an illumination system IL (e.g., an illuminator) configured to condition a radiation beam B (e.g., a deep ultra violet (DUV) radiation beam or an extreme ultra violet (EUV) radiation beam); a support structure MT (e.g., a mask table) configured to support a patterning device MA (e.g., a mask, a reticle, or a dynamic patterning device) and connected to a first positioner PM configured to accurately position the patterning device MA; and, a substrate holder such as a substrate table WT (e.g., a wafer table) configured to hold a substrate W (e.g., a resist-coated wafer) and connected to a second positioner PW configured to accurately position the substrate W. Lithographic apparatuses 100 and 100' also have a projection system PS configured to project a pattern imparted to the radiation beam B by patterning device MA onto a target portion C (e.g., a portion including one or more dies) of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatuses 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system. Immersion techniques provide for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illumination system IL receives a radiation beam B from a radiation source SO. The radiation source SO and the lithographic apparatus 100 or 100' can be separate physical entities, for example, when the radiation source SO is an excimer laser. In such cases, the radiation source SO is not considered to form part of the lithographic apparatus 100 or 100', and the radiation beam B passes from the radiation source SO to the illumination system IL with the aid of a beam delivery system BD (e.g., shown in FIG. 1B) including, for example, suitable directing mirrors and/or a beam expander. In other cases, the radiation source SO can be an integral part of the lithographic apparatus 100 or 100', for example, when the radiation source SO is a mercury lamp. The radiation source SO and the illuminator IL, together with the beam delivery system BD, if required, can be referred to as a radiation system.

The illumination system IL can include an adjuster AD (e.g., shown in FIG. 1B) for adjusting the angular intensity distribution of the radiation beam. Generally, at least the outer and/or inner radial extent (commonly referred to as "a-outer" and "a-inner," respectively) of the intensity distribution in a pupil plane of the illuminator can be adjusted. In addition, the illumination system IL can include various other components (e.g., shown in FIG. 1B), such as an integrator IN and a radiation collector CO (e.g., a condenser or collector optic). The illumination system IL can be used to condition the radiation beam B to have a desired uniformity and intensity distribution in its cross section.

Referring to FIG. 1A, the radiation beam B is incident on the patterning device MA (e.g., a mask), which is held on the support structure MT (e.g., a mask table), and is patterned by the patterning device MA. In lithographic apparatus 100, the radiation beam B is reflected from the patterning device MA. After being reflected from the patterning device MA, the radiation beam B passes through the projection system PS, which focuses the radiation beam B onto a target portion C of the substrate W. With the aid of the second positioner PW and position sensor IFD2 (e.g., an interferometric device, linear encoder, or capacitive sensor), the substrate table WT can be moved accurately (e.g., so as to position different target portions C in the path of the radiation beam B). Similarly, the first positioner PM and another position sensor IFD1 (e.g., an interferometric device, linear encoder, or capacitive sensor) can be used to accurately position the patterning device MA with respect to the path of the radiation beam B. Patterning device MA and substrate W can be aligned using mask alignment marks M1 and M2 and substrate alignment marks P1 and P2.

Referring to FIG. 1B, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zeroth-order diffraction generates diverted diffracted beams with a change of direction in a direction perpendicular to the lines. Undiffracted beams (e.g., so-called zeroth-order diffracted beams) traverse the pattern without any change in propagation direction. The zeroth-order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth-order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth-order diffracted beams, but also first-order or first- and higher-order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the substrate W to create an image of the mask pattern MP at highest possible resolution and process window (e.g., usable depth of focus in combination with tolerable exposure dose deviations). In some aspects, astigmatism aberration can be reduced by providing radiation poles (not shown) in opposite quadrants of the illumination system pupil IPU. Further, in some aspects, astigmatism aberration can be reduced by blocking the zeroth-order beams in the pupil conjugate PPU of the projection system associated with radiation poles in opposite quadrants. This is described in more detail in U.S. Pat. No. 7,511,799, issued Mar. 31, 2009, which is incorporated by reference herein in its entirety.

With the aid of the second positioner PW and position sensor IFD (e.g., an interferometric device, linear encoder, or capacitive sensor), the substrate table WT can be moved accurately (e.g., so as to position different target portions C in the path of the radiation beam B). Similarly, the first positioner PM and another position sensor (not shown in FIG. 1B) can be used to accurately position the patterning device MA with respect to the path of the radiation beam B (e.g., after mechanical retrieval from a mask library or during a scan).

In general, movement of the support structure MT can be realized with the aid of a long-stroke positioner (coarse positioning) and a short-stroke positioner (fine positioning), which form part of the first positioner PM. Similarly, movement of the substrate table WT can be realized using a long-stroke positioner and a short-stroke positioner, which form part of the second positioner PW. In the case of a stepper (as opposed to a scanner), the support structure MT can be connected to a short-stroke actuator only or can be fixed. Patterning device MA and substrate W can be aligned using mask alignment marks M1, M2, and substrate alignment marks P1, P2. Although the substrate alignment marks (as illustrated) occupy dedicated target portions, they can be located in spaces between target portions (e.g., scribe-lane alignment marks). Similarly, in situations in which more than one die is provided on the patterning device MA, the mask alignment marks can be located between the dies.

Support structure MT and patterning device MA can be in a vacuum chamber V, where an in-vacuum robot IVR can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot IVR. In some instances, both the in-vacuum and out-of-vacuum robots need to be calibrated for a smooth transfer of any payload (e.g., a mask) to a fixed kinematic mount of a transfer station.

The lithographic apparatuses 100 and 100' can be used in at least one of the following modes:

1. In step mode, the support structure MT and the substrate table WT are kept essentially stationary, while an entire pattern imparted to the radiation beam B is projected onto a target portion C at one time (e.g., a single static exposure). The substrate table WT is then shifted in the X and/or Y direction so that a different target portion C can be exposed.

2. In scan mode, the support structure MT and the substrate table WT are scanned synchronously while a pattern imparted to the radiation beam B is projected onto a target portion C (e.g., a single dynamic exposure). The velocity and direction of the substrate table WT relative to the support structure MT (e.g., mask table) can be determined by the (de-)magnification and image reversal characteristics of the projection system PS.

3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

Combinations and/or variations on the described modes of use or entirely different modes of use can also be employed.

In a further aspect, lithographic apparatus 100 includes an EUV source, which is configured to generate a beam of EUV radiation for EUV lithography. In general, the EUV source is configured in a radiation system, and a corresponding illumination system is configured to condition the EUV radiation beam of the EUV source.

Figure 2:
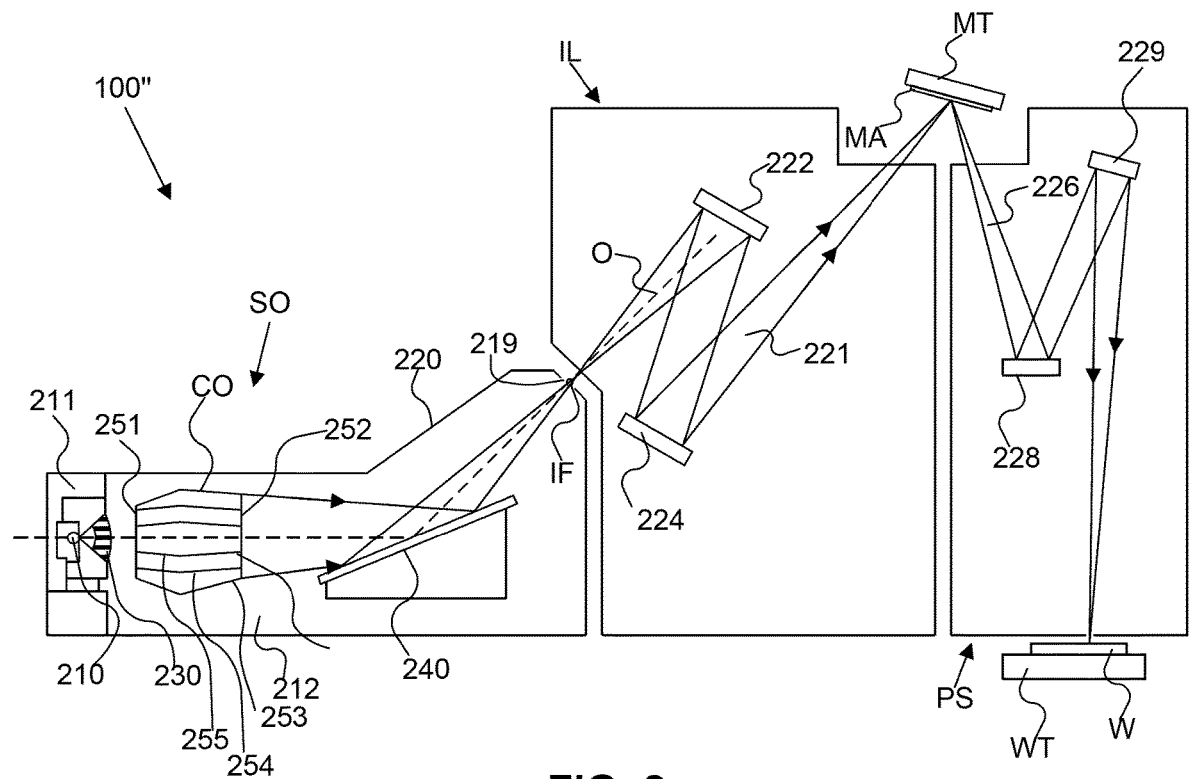
FIG. 2 is a more detailed schematic illustration of the reflective lithographic apparatus shown in FIG. 1A according to some aspects of the present disclosure.

FIG. 2 shows the lithographic apparatus 100 in more detail, including the radiation source SO (e.g., a source collector apparatus), the illumination system IL, and the projection system PS. As shown in FIG. 2, the lithographic apparatus 100 is illustrated from a point of view (e.g., a side view) that is normal to the XZ plane (e.g., the X-axis points to the right and the Z-axis points upward).

The radiation source SO is constructed and arranged such that a vacuum environment can be maintained in an enclosing structure 220. The radiation source SO includes a source chamber 211 and a collector chamber 212 and is configured to produce and transmit EUV radiation. EUV radiation can be produced by a gas or vapor, for example xenon (Xe) gas, lithium (Li) vapor, or tin (Sn) vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, about 10.0 pascals (Pa) of Xe gas, Li vapor, Sn vapor, or any other suitable gas or vapor can be used for efficient generation of the radiation. In some aspects, a plasma of excited tin is provided to produce EUV radiation.

The radiation emitted by the EUV radiation emitting plasma 210 is passed from the source chamber 211 into the collector chamber 212 via an optional gas barrier or contaminant trap 230 (e.g., in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap 230 further indicated herein at least includes a channel structure.

The collector chamber 212 can include a radiation collector CO (e.g., a condenser or collector optic), which can be a so-called grazing incidence collector. Radiation collector CO has an upstream radiation collector side 251 and a downstream radiation collector side 252. Radiation that traverses radiation collector CO can be reflected off a grating spectral filter 240 to be focused in a virtual source point IF. The virtual source point IF is commonly referred to as the intermediate focus, and the source collector apparatus is arranged such that the virtual source point IF is located at or near an opening 219 in the enclosing structure 220. The virtual source point IF is an image of the EUV radiation emitting plasma 210. Grating spectral filter 240 is used in particular for suppressing infrared (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination system IL and projection system PS. Optionally, the grating spectral filter 240 can be present depending upon the type of lithographic apparatus. Further, there can be more mirrors present than those shown in the FIG. 2. For example, there can be one to six additional reflective elements present in the projection system PS than shown in FIG. 2.

Radiation collector CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a radiation collector CO of this type is preferably used in combination with a discharge produced plasma (DPP) source.

Example Lithographic Cell

Figure 3:
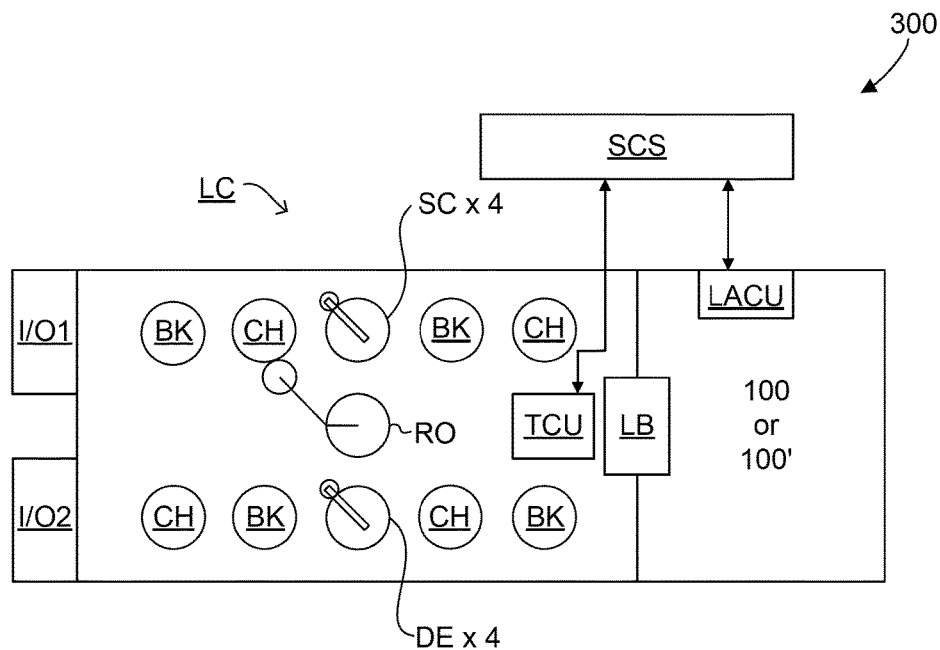
FIG. 3 is a schematic illustration of an example lithographic cell according to some aspects of the present disclosure.

FIG. 3 shows a lithographic cell 300, also sometimes referred to a lithocell or cluster. Lithographic apparatus 100 or 100' can form part of lithographic cell 300. Lithographic cell 300 can also include one or more apparatuses to perform pre- and post-exposure processes on a substrate. For example, these apparatuses can include spin coaters SC to deposit resist layers, developers DE to develop exposed resist, chill plates CH, and bake plates BK. A substrate handler RO (e.g., a robot) picks up substrates from input/output ports I/O1 and I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Example Radiation Source

Figure 4:
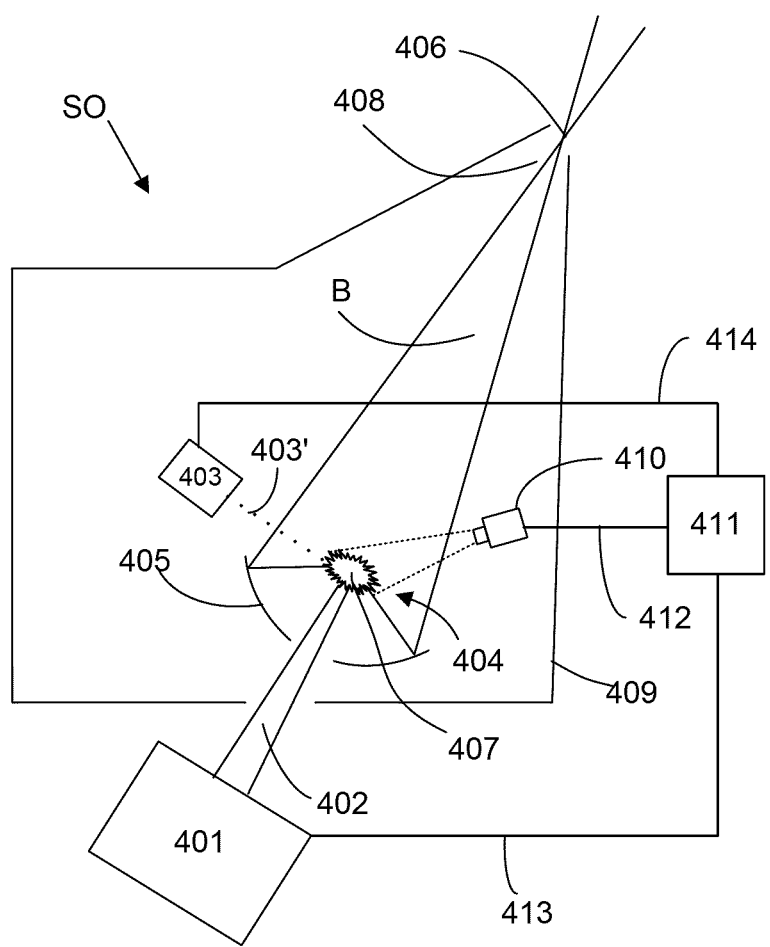
FIG. 4 is a schematic illustration of an example radiation source for an example reflective lithographic apparatus according to some aspects of the present disclosure.

An example of the radiation source SO for an example reflective lithographic apparatus is shown in FIG. 4. As shown in FIG. 4, the radiation source SO is illustrated from a point of view (e.g., a top view) that is normal to the XY plane as described below.

The radiation source SO shown in FIG. 4 is of a type which can be referred to as a laser produced plasma (LPP) source. A laser system 401, which can for example include a carbon dioxide ($CO_2$) laser, is arranged to deposit energy via one or more laser beams 402 into fuel targets 403', such as one or more discrete tin (Sn) droplets, which are provided from a fuel target generator 403 (e.g., example, fuel emitter, droplet generator). According to some aspects, laser system 401 can be, or can operate in the fashion of, a pulsed, continuous wave or quasi-continuous wave laser. The trajectory of fuel targets 403' (e.g., example, droplets) emitted from the fuel target generator 403 can be parallel to an X-axis. According to some aspects, the one or more laser beams 402 propagate in a direction parallel to a Y-axis, which is perpendicular to the X-axis. A Z-axis is perpendicular to both the X-axis and the Y-axis and extends generally into (or out of) the plane of the page, but in other aspects, other configurations are used. In some embodiments, the laser beams 402 may propagate in a direction other than parallel to the Y-axis, i.e., in a direction other than orthogonal to the X-axis direction of the trajectory of the fuel targets.

Although tin is referred to in the following description, any suitable target material can be used. The target material can for example be in liquid form, and can for example be a metal or alloy. Fuel target generator 403 can include a nozzle configured to direct tin, e.g., in the form of fuel targets 403' (e.g., discrete droplets) along a trajectory towards a plasma formation region 404. Throughout the remainder of the description, references to "fuel", "fuel target" or "fuel droplet" are to be understood as referring to the target material (e.g., droplets) emitted by fuel target generator 403. Fuel target generator 403 can include a fuel emitter. The one or more laser beams 402 are incident upon the target material (e.g., tin) at the plasma formation region 404. The deposition of laser energy into the target material creates a plasma 407 at the plasma formation region 404. Radiation, including EUV radiation, is emitted from the plasma 407 during de-excitation and recombination of ions and electrons of the plasma.

The EUV radiation is collected and focused by a collector 405 (e.g., radiation collector CO). In some aspects, collector 405 can include a near normal-incidence radiation collector (sometimes referred to more generally as a normal-incidence radiation collector). The collector 405 can be a multilayer structure, which is arranged to reflect EUV radiation (e.g., EUV radiation having a desired wavelength such as about 13.5 nm). According to some aspects, collector 405 can have an ellipsoidal configuration, having two focal points. A first focal point can be at the plasma formation region 404, and a second focal point can be at an intermediate focus 406, as discussed herein.

In some aspects, laser system 401 can be located at a relatively long distance from the radiation source SO. Where this is the case, the one or more laser beams 402 can be passed from laser system 401 to the radiation source SO with the aid of a beam delivery system (not shown) including, for example, suitable directing mirrors and/or a beam expander, and/or other optics. Laser system 401 and the radiation source SO can together be considered to be a radiation system.

Radiation that is reflected by collector 405 forms a radiation beam B. The radiation beam B is focused at a point (e.g., the intermediate focus 406) to form an image of plasma formation region 404, which acts as a virtual radiation source for the illumination system IL (see FIG. 2). The point at which the radiation beam B is focused can be referred to as the intermediate focus (e.g., intermediate focus 406). The radiation source SO is arranged such that the intermediate focus 406 is located at or near to an opening 408 in an enclosing structure 409 of the radiation source SO.

The radiation beam B passes from the radiation source SO into the illumination system IL, which is configured to condition the radiation beam B. The radiation beam B passes from the illumination system IL and is incident upon the patterning device MA held by the support structure MT. The patterning device MA reflects and patterns the radiation beam B. Following reflection from the patterning device MA the patterned radiation beam B enters the projection system PS. The projection system includes a plurality of mirrors, which are configured to project the radiation beam B onto a substrate W held by the substrate table WT. The projection system PS can apply a reduction factor to the radiation beam, forming an image with features that are smaller than corresponding features on the patterning device MA. For example, a reduction factor of four can be applied. Although the projection system PS is shown as having two mirrors in FIG. 2, the projection system can include any number of mirrors (e.g., six mirrors).

The radiation source SO can also include components which are not illustrated in FIG. 4. For example, a spectral filter can be provided in the radiation source SO. The spectral filter can be substantially transmissive for EUV radiation but substantially blocking for other wavelengths of radiation such as infrared radiation.

The radiation source SO (or radiation system) may further include a fuel target imaging system to obtain images of fuel targets (e.g., droplets) in the plasma formation region 404 or, more particularly, to obtain images of shadows of the fuel targets. The fuel target imaging system can detect light diffracted from the edges of the fuel targets. References to images of the fuel targets in the following text should be understood also to refer to images of shadows of the fuel targets or diffraction patterns caused by the fuel targets.

The fuel target imaging system can include a photodetector such as a CCD array or a CMOS sensor, but it will be appreciated that any imaging device suitable for obtaining images of the fuel targets can be used. It will be appreciated that the fuel target imaging system can include optical components, such as one or more lenses, in addition to a photodetector. For example, the fuel target imaging system can include a camera 410, e.g., a combination of a photosensor (or: photodetector) and one or more lenses. The optical components can be selected so that the photosensor or camera 410 obtains near-field images and/or far-field images. The camera 410 can be positioned within the radiation source SO at any appropriate location from which the camera has a line of sight to the plasma formation region 404 and one or more markers (not shown in FIG. 4) provided on the collector 405. It may be necessary, however, to position the camera 410 away from the propagation path of the one or more laser beams 402 and from the trajectory of the fuel targets emitted from fuel target generator 403 so as to avoid damage to the camera 410. According to some aspects, the camera 410 is configured to provide images of the fuel targets to a controller 411 via a connection 412. The connection 412 is shown as a wired connection, though it will be appreciated that the connection 412 (and other connections referred to herein) can be implemented as either a wired connection or a wireless connection or a combination thereof.

As shown in FIG. 4, the radiation source SO can include a fuel target generator 403 configured to generate and emit fuel targets 403' (e.g., discrete tin droplets) towards a plasma formation region 404. The radiation source SO can further include a laser system 401 configured to hit one or more of the fuel targets 403' with one or more laser beams 402 for generating a plasma 407 at the plasma formation region 404. The radiation source SO can further include a collector 405 (e.g., a radiation collector CO) configured to collect radiation emitted by the plasma 407. In some aspects, a collector flow ring CFR (not shown in FIG. 4) can be disposed adjacent to the collector 405 to mitigate an accumulation of fuel debris (e.g., tin) in the radiation source SO, among other features. The collector flow ring CFR can be disposed along an axis parallel to the X-axis (e.g., near the trajectory of fuel targets 403' emitted from the fuel target generator 403).

Example Collector Flow Ring

Figure 5:
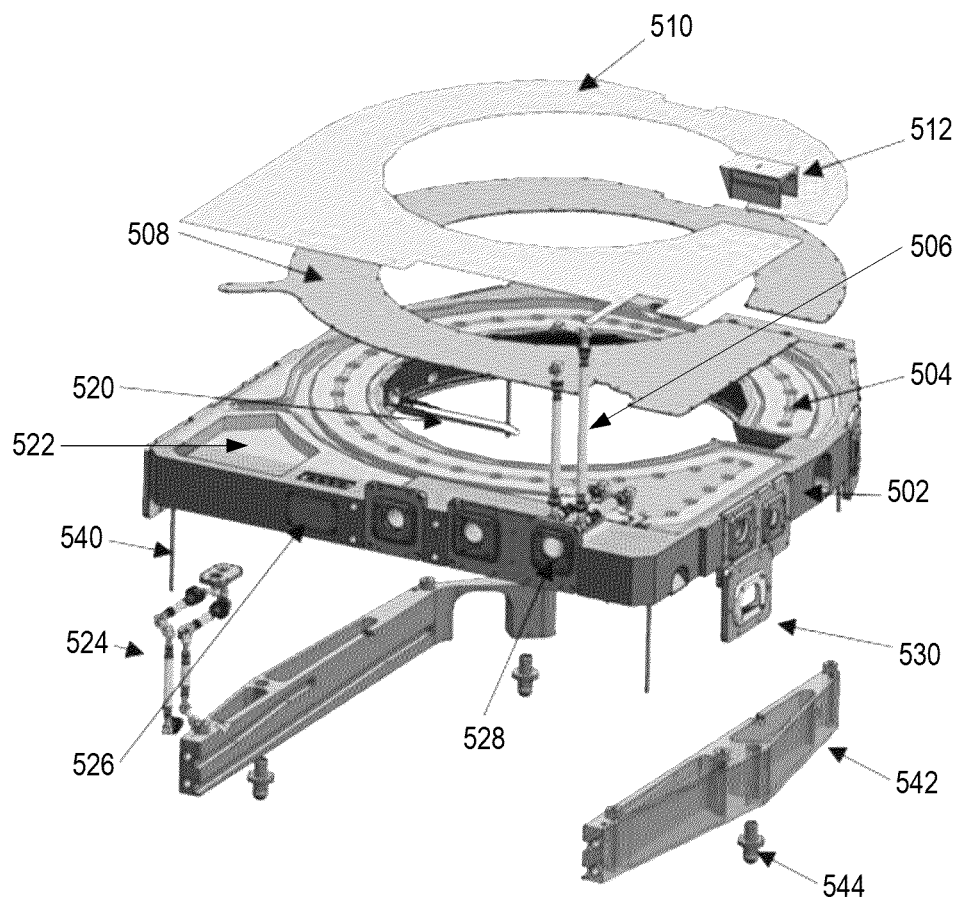
FIG. 5 is a schematic illustration of an example collector flow ring according to some aspects of the present disclosure.

FIG. 5 illustrates an exploded view of an example collector flow ring (CFR) 500 that can be disposed adjacent to a radiation collector CO (e.g., collector 405 shown in FIG. 4) in a radiation source SO of an example reflective lithographic apparatus to mitigate an accumulation of fuel debris (e.g., tin) in the radiation source SO. CFR 500 may be positioned to direct flow into the collector 405 such as may mitigate an accumulation of fuel debris (e.g., tin debris) in the radiation source SO. In some aspects, a total weight of the example CFR 500 can be less than about 200 kilograms (kg) or less than about 150 kg. In some aspects, without the cooling fluid supply 506 and the gas supply 524, a total size of the example CFR 500 can be about 1.2 m by 1.0 m by 90 mm (e.g., the thickness of the CFR housing 502). In some aspects, with the cooling fluid supply 506 and the gas supply 524, a total size of the example CFR 500 can be about 1.2 m by 1.0 m by 800 mm, but other sizes are used in other embodiments.

In some aspects, the example CFR 500 can include a CFR housing 502 configured to mitigate an accumulation of fuel debris (e.g., tin) in an EUV radiation system (e.g., radiation source SO shown in FIGS. 1A and 4). In some aspects, the CFR housing 502 can be formed of, or may include aluminum (Al). In some aspects, the CFR housing 502 can include a coating of at least one material selected from the group consisting of titanium nitride (TiN), tin (Sn), and nickel (Ni).

In some aspects, the CFR housing 502 can include a plurality of showerhead flow channel outlets configured to output a plurality of first gaseous fluid flows (e.g., H2 flows) over a plurality of portions of a plasma-facing surface of the CFR housing 502. In some aspects, the CFR housing 502 can include a gutter purge flow channel outlet configured to output a second gaseous fluid flow (e.g., H2 flow) over a fuel debris-receiving surface of the CFR housing 502. In some aspects, the plurality of showerhead flow channel outlets and the gutter purge flow channel outlet can be configured to be fluidically coupled to a gaseous fluid chamber configured to produce a collective non-uniformity of gaseous fluid flow between the plurality of first gaseous fluid flows and the second gaseous fluid flow of less than about five percent, less than about three percent, or less than about one percent.

In some aspects, the CFR housing 502 can include a shroud mounting structure configured to support a shroud assembly 520, e.g., including, but not limited to, a ceramic shroud, that can be configured to protect the fuel targets (e.g., fuel targets 403'). In some aspects, the CFR housing 502 can include a cooling flow channel configured to transport a fluid (e.g., water, deionized water, a refrigerant, a nanofluid including nanoparticles, or any other suitable fluid) configured to remove heat from at least a portion of the CFR housing 502 during an EUV radiation generation operation of the EUV radiation system. In some aspects, the CFR housing 502 can include a plurality of optical metrology ports configured to receive a plurality of optical metrology tubes. In some aspects, the CFR housing 502 can include a plurality of thermal metrology channels configured to support a plurality of thermal metrology devices (e.g., thermocouple-based devices). In some aspects, the CFR housing 502 can include a weight relief cavity 522 configured to reduce a total mass of the CFR housing 502 and modify a center of gravity of the CFR housing 502 (e.g., to balance the CFR housing 502).

In some aspects, the CFR housing 502 can include a plurality of collector guide rail mounting structures 540 configured to attach to a plurality of collector guide rails 542. In some aspects, the plurality of collector guide rails 542 can be configured to steer the radiation collector CO along a safe path into a precisely positioned mounting location with respect to the collector such as collector 405 of FIG. 4 (e.g., within a tolerance of about 1 mm, 100 microns, about 10 microns, or about 1 micron). For example, the plurality of collector guide rails 542 can be a pair of precision-made guide rails that give the radiation collector CO a path for install and an alignment within about 1 mm, 100 microns, about 10 microns, or about 1 micron. In some aspects, the example CFR 500 can include a plurality of CFR mounts 544 configured to attach to the plurality of collector guide rails 542 and mount the example CFR 500 to a radiation collector CO (see FIG. 2).

In some aspects, the example CFR 500 can include a cooling fluid channel assembly 504 (including, but not limited to, a cooling fluid channel and cooling fluid connections, valves, or both), a cooling fluid supply 506 (e.g., a water supply), and cooling fluid channel cover 508. In some aspects, the cooling fluid channel assembly 504 can include a cooling fluid channel within the gas plenum with a combined O-ring and gasket sealing structure that allows for the thermal path to be shorter than conventional designs. In some aspects, the cooling fluid channel assembly 504 provides active cooling to sink heat away from the example CFR 500, the CFR housing 502, or any component included therein or mechanically connected thereto. In some aspects, the cooling fluid channel assembly 504 can be bolted onto flat, interfacing surfaces of the CFR housing 502. In some aspects, the bottom surface of the water channel bottom surface can also be tin coated to provide increased thermal heat transfer benefits.

In some aspects, the example CFR 500 can include a tin phobic sheet 510. Optionally, the example CFR 500 can include a tin writing insert 512 or a placeholder for a tin writing insert design that provides the ability to upgrade the tin writing insert 512.

In some aspects, the example CFR 500 can include a shroud assembly 520, which can be a precision shroud mounting configured to self-center. In some aspects, the example CFR 500 can include a gaseous fluid source, such as a gas supply 524 (e.g., an H2 supply). In some aspects, the example CFR 500 can include a thermocouple access panel 526, which can be removably attached to the CFR housing 502 and configured to provide access to the plurality of thermal metrology devices disposed in the plurality of thermal metrology channels in the CFR housing 502. For example, the example CFR 500 can include four thermocouple devices (e.g., two thermocouple devices on each side of the example CFR 500).

In some aspects, the example CFR 500 can include a plurality of optical metrology tubes 528 configured to provide metrology FOV for multiple optical metrology ports (e.g., thirteen metrology ports) disposed through the CFR housing 502. In some aspects, the example CFR 500 can include a plurality of optical metrology face seals 530, which can be resistance seals configured to close the gap between an interior surface of the CFR housing 502 and the optical metrology tubes 528 within the positional tolerance range of the example CFR 500 (e.g., within a tolerance of about 1 mm, 100 microns, about 10 microns, or about 1 micron). In some aspects, the plurality of optical metrology face seals 530 can be flexible seals that contain metrology flow exhaust and can adapt to misalignment of the position of the example CFR 500. In some aspects, the example CFR 500 can provide for shrink-fit optical metrology tube sealing that uses the inserted optical metrology tubes 528 to seal the breakthroughs that can occur due to boring operation to fit the optical metrology tubes 528 (e.g., shrink-fit tubing to seal flow between plenums).

FIGS. 6A, 6B, 6C, and 6D are schematic illustrations of portions of example regions of an example CFR 600 according to some aspects of the present disclosure.

Figure 6A:
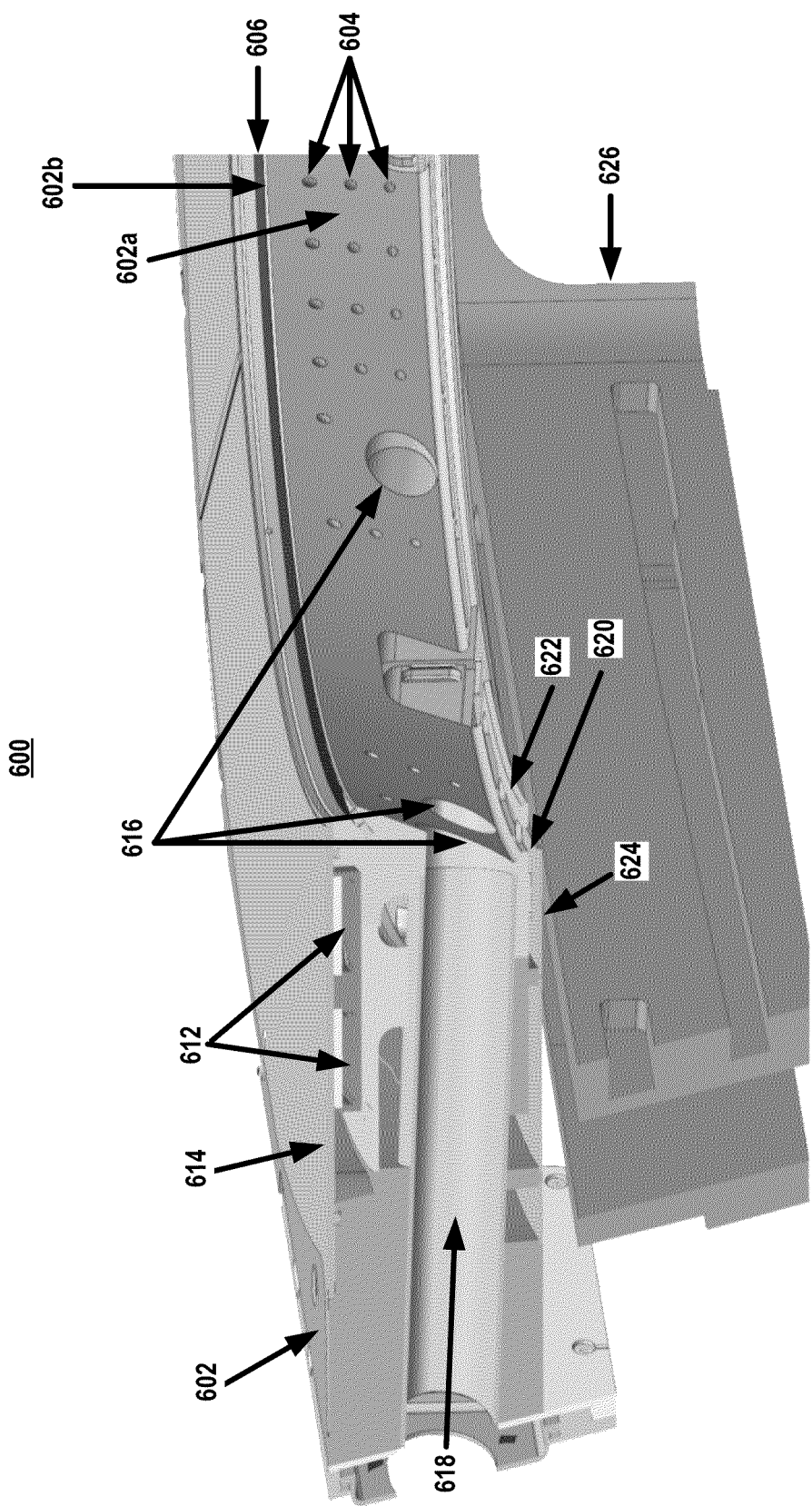
FIGS. 6A, 6B, 6C, and 6D are schematic illustrations of portions of example regions of an example collector flow ring according to some aspects of the present disclosure.

FIG. 6A illustrates a cut-away portion of a first example region of the example CFR 600 that includes a CFR housing 602 according to some aspects of the present disclosure. In some aspects, a total size of the CFR housing 602 can be about 1.2 m by 1.0 m by 90 mm but various other suitable sizes are used in other embodiments.

The CFR housing 602 can include a plurality of showerhead flow channel outlets 604 configured to output a plurality of first gaseous fluid flows over a plurality of portions of a plasma-facing surface 602a of the CFR housing 602. The CFR housing 602 can include a gutter purge flow channel outlet 606 configured to output a second gaseous fluid flow over a fuel debris-receiving surface 602b of the CFR housing 602.

The CFR housing 602 can include cooling flow channels 612 configured to transport a liquid fluid configured to remove heat from at least a portion of the CFR housing 602 during an EUV radiation generation operation of the EUV radiation system. The CFR housing 602 can include a cooling fluid channel cover 614 configured (e.g., at least in part) to seal the cooling flow channels 612.

The CFR housing 602 can include a plurality of optical metrology ports 616 configured to receive and support a plurality of optical metrology tubes 618. In some aspects, the plurality of showerhead flow channel outlets 604, the gutter purge flow channel outlet 606, and the plurality of optical metrology ports 616 can be disposed on a main body of the CFR housing 602 that may be a single component or piece.

The CFR housing 602 can include a perimeter flow channel outlet 620 configured to output a perimeter gaseous fluid flow over a surface of a perimeter flow ring 622 of the CFR housing 602. The perimeter flow ring 622 can include a sieve ring of holes to provide restriction on the perimeter gaseous fluid flow to promote uniformity. A perimeter skin plate 624 can be welded on the bottom of the CFR housing 602 with aero bosses to provide stiffness and constant gap thickness so that the perimeter gaseous fluid flow becomes fully developed and is uniform.

In some aspects, the CFR housing 602 can include a plurality of collector guide rail mounting structures configured to attach to a plurality of collector guide rails, such as collector guide rail 626.

Figure 6B:
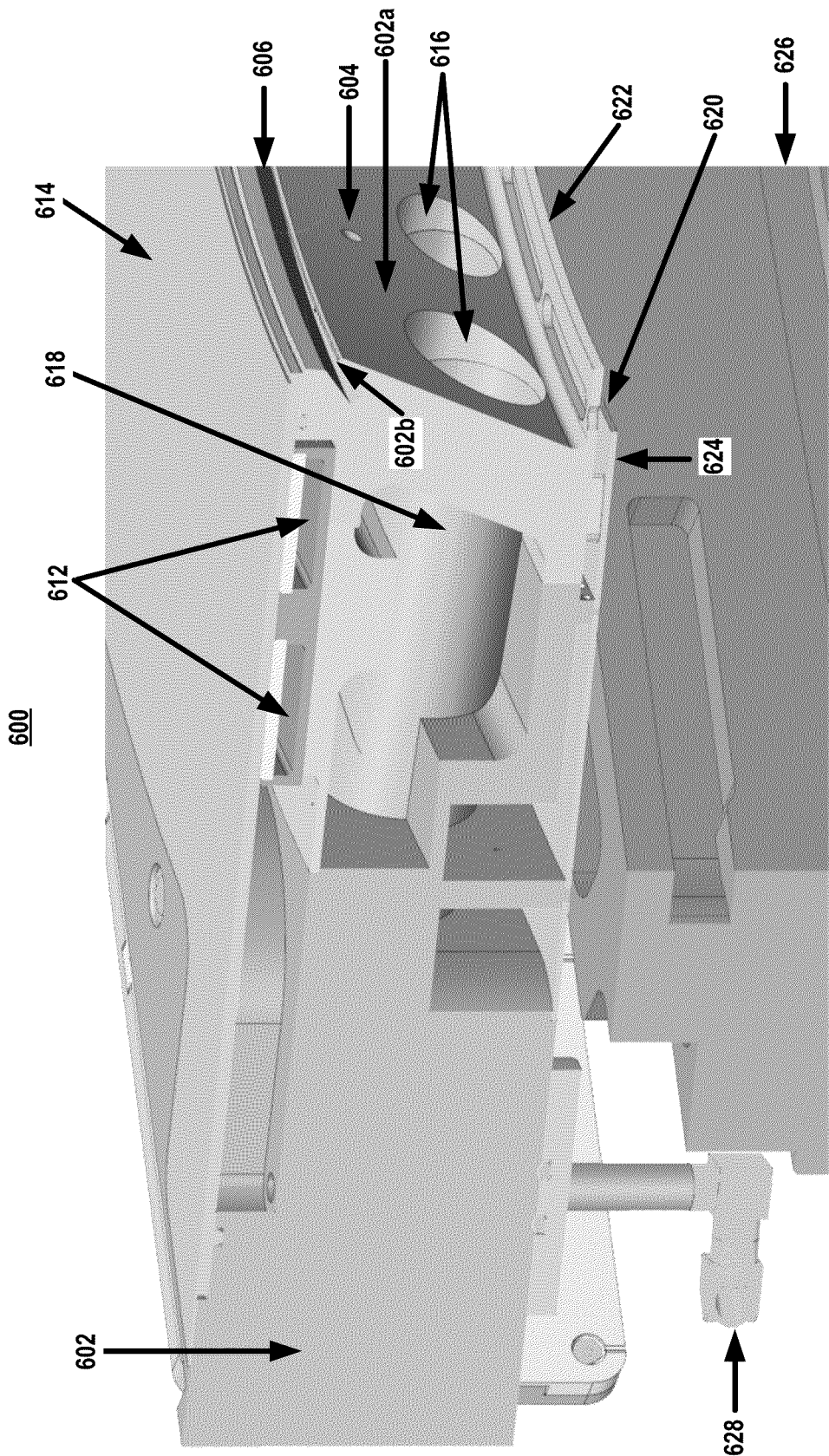

FIG. 6B illustrates a cut-away portion of a second example region of the example CFR 600 according to some aspects of the present disclosure. As shown in FIG. 6B, the CFR housing 602 can include a gas supply 628 (e.g., a gaseous fluid source such as an H2 supply).

Figure 6C:
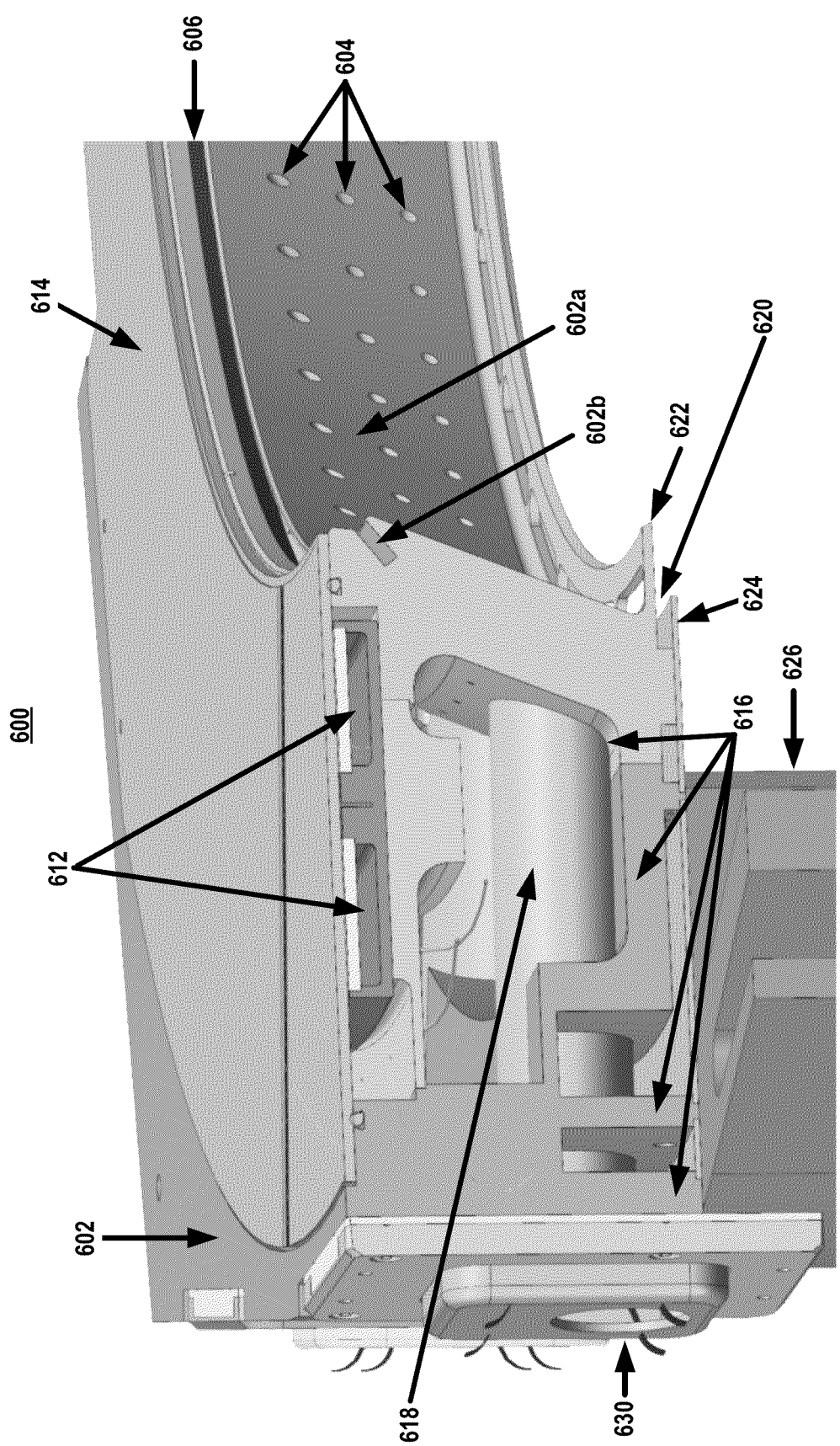

FIG. 6C illustrates a cut-away portion of a third example region of the example CFR 600 according to some aspects of the present disclosure. As shown in FIG. 6C, the CFR housing 602 can include an optical metrology face seal 630 configured to attach one of the plurality optical metrology tubes 618 to the CFR housing 602.

Figure 6D:
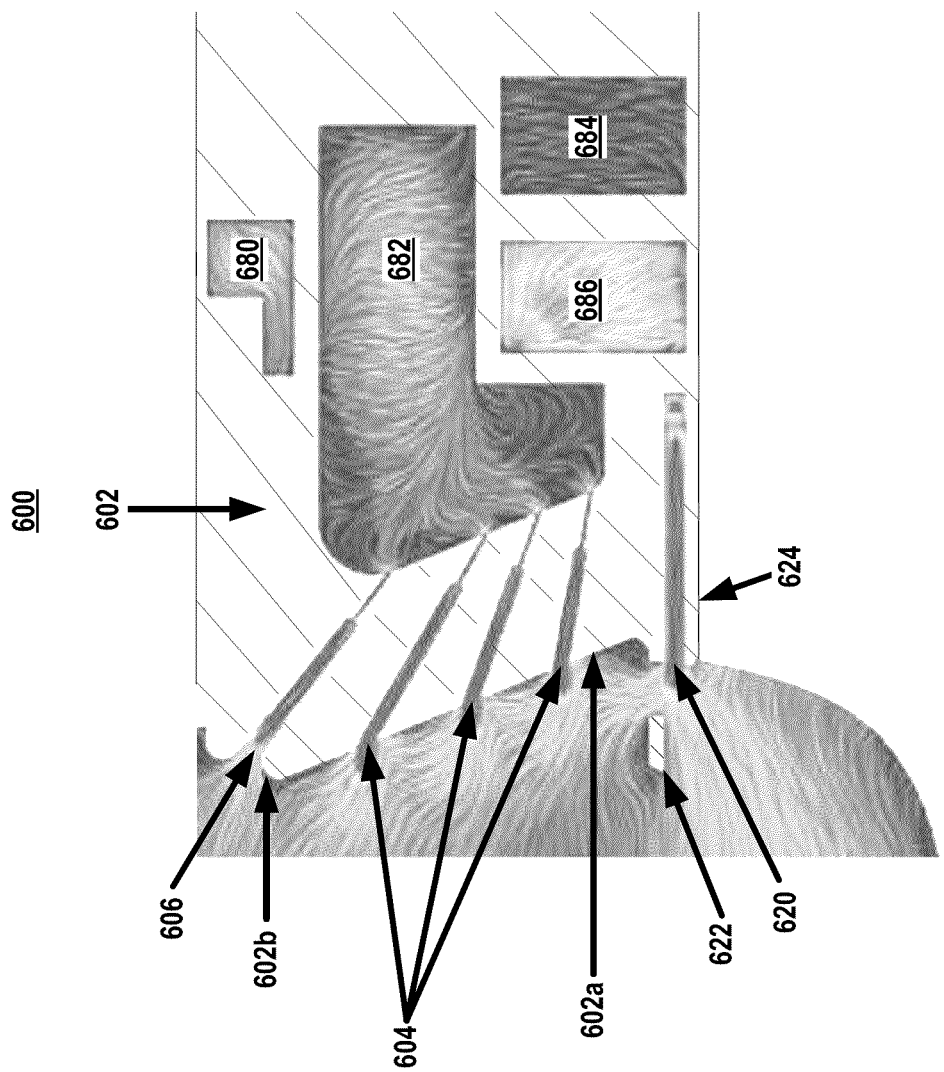

FIG. 6D illustrates a portion of a fourth example region of the example CFR 600 according to some aspects of the present disclosure. As shown in FIG. 6D, the CFR housing 602 can include a showerhead flow distribution plenum 680, which can be a first chamber configured to receive a single inlet fluidically connected to gas supply 628 and spread the flow as far around the CFR as possible. The CFR housing 602 can include a showerhead flow expansion plenum 682, which can be configured to slow the flow, provide a reservoir of pressure for the outlet flow, and assist with distribution for the furthest flow points. Although not shown in FIG. 6D, showerhead flow distribution plenum 680 may be fluidically coupled to showerhead flow expansion plenum 682. The CFR housing 602 can include a perimeter flow distribution plenum 684, which can be configured to receive flow from the single inlet and spread it as much as possible. The perimeter flow distribution plenum 684 can be machined out and sealed with aluminum skin plate from the bottom. The CFR housing 602 can include a perimeter flow expansion plenum 686, which can have a function that is substantially similar to the as the showerhead flow expansion plenum 682 (e.g., to slows the gas, expand the gas to provide constant pressure reservoir, and assist with distribution). The perimeter flow expansion plenum 686 can be machined out and sealed with the perimeter skin plate 624 (e.g., an aluminum skin plate) on the bottom of the CFR housing 602.

As further shown in FIG. 6D, the plurality of showerhead flow channel outlets 604 and the gutter purge flow channel outlet 606 can be manufactured by any of various suitable methods such as by machining counterbored holes at precise angles. Each hole angle determines the restriction length, which must be equal throughout all the holes in order for the flow to be uniform. Counterbores provide the development length so the flow exits fully developed.

In some aspects, a gaseous fluid flow (e.g., H2 at about 0.5 bar generated by a gaseous fluid source) through (a) the showerhead flow distribution plenum 680, the showerhead flow expansion plenum 682, the plurality of showerhead flow channel outlets 604, and the gutter purge flow channel outlet 606, and (b) the perimeter flow distribution plenum 684, the perimeter flow expansion plenum 686, and the perimeter flow channel outlet 620 can be configured to produce a collective non-uniformity of gas flow between a plurality of first gaseous fluid flows (e.g., output from the plurality of showerhead flow channel outlets 604 at about 15 to 50 standard liters per minute (slm)), a second gaseous fluid flow (e.g., output from the gutter purge flow channel outlet 606 at about 15 to 50 slm), and a third gaseous fluid flow (e.g., output from the perimeter flow channel outlet 620 at about 50 to 130 slm) of less than about five percent, less than about three percent, or less than about one percent. In some aspects, the gaseous fluid flow can be configured to produce a collective pressure drop between the plurality of first gaseous fluid flows, the second gaseous fluid flow, and the third gaseous fluid flow of less than about 15 kiloPascals (kPa), 10 kPa, or 5 kPa. In some aspects, the gaseous fluid flow can be configured to produce a flow distribution for the plurality of first gaseous fluid flows and the second gaseous fluid flow of about 70 percent and about 30 percent, respectively. In some aspects, the gaseous fluid flow can be configured to produce a flow distribution for the third gaseous fluid flow of about 50 percent upward flow (e.g., across the plasma-facing surface 602a) and 50 percent flow towards the radiation collector CO. In other embodiments, any of various other flow rates and relative flow rates may be used.

Example Processes for Manufacturing a CFR Housing

Figure 7:
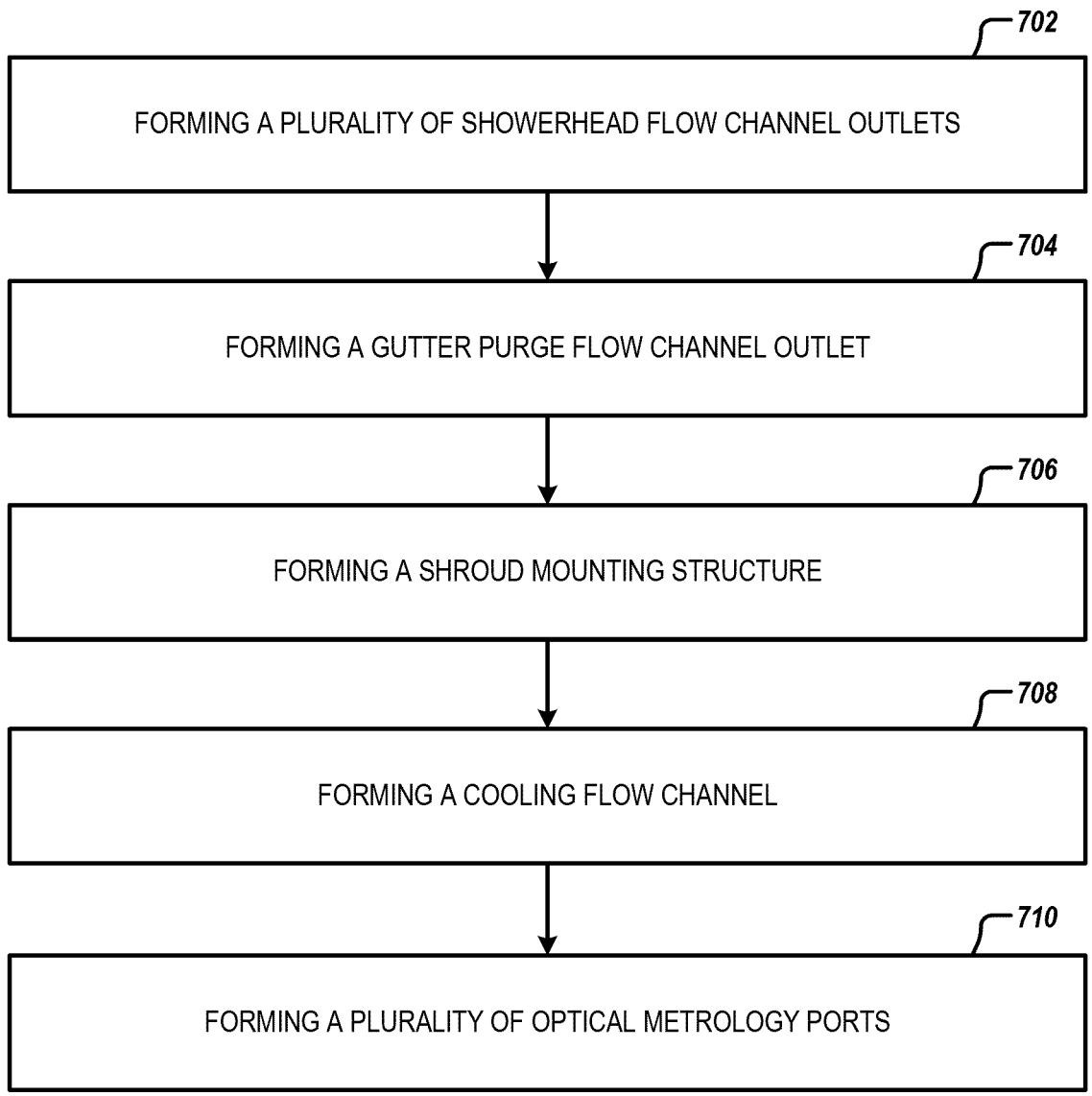
FIG. 7 is a flow chart showing an example of a method for manufacturing an apparatus according to some aspects of the present disclosure or portion(s) thereof.

FIG. 7 is an example method 700 for manufacturing a CFR housing (e.g., the CFR housing 502 or 602) configured to mitigate an accumulation of fuel debris in an EUV radiation system, according to some aspects of the present disclosure or portion(s) thereof. The operations described with reference to example method 700 can be performed by, or according to, any of the systems, apparatuses, components, techniques, or combinations thereof described herein, such as those described with reference to FIGS. 1-6.

At operation 702, the method can include forming a plurality of showerhead flow channel outlets (e.g., plurality of showerhead flow channel outlets 604) configured to output a plurality of first gaseous fluid flows over a plurality of portions of a plasma-facing surface (e.g., plasma-facing surface 602a) of the CFR housing. In some aspects, the forming of the plurality of showerhead flow channel outlets can be accomplished using suitable mechanical or other methods and include forming the plurality of showerhead flow channel outlets in accordance with any aspect or combination of aspects described with reference to FIGS. 1-6.

At operation 704, the method can include forming a gutter purge flow channel outlet (e.g., gutter purge flow channel outlet 606) configured to output a second gaseous fluid flow over a fuel debris-receiving surface (e.g., fuel debris-receiving surface 602b) of the CFR housing. In some aspects, the forming of the gutter purge flow channel outlet can be accomplished using suitable mechanical or other methods and can include forming the gutter purge flow channel outlet in accordance with any aspect or combination of aspects described with reference to FIGS. 1-6.

At operation 706, the method can include forming a shroud mounting structure configured to support a shroud assembly (e.g., shroud assembly 520). In some aspects, the forming of the shroud mounting structure can be accomplished using suitable mechanical or other methods and include forming the shroud mounting structure in accordance with any aspect or combination of aspects described with reference to FIGS. 1-6.

At operation 708, the method can include forming a cooling flow channel (e.g., cooling flow channel 612) configured to transport a fluid configured to remove heat from at least a portion of the CFR housing during an EUV radiation generation operation of the EUV radiation system. In some aspects, the forming of the cooling flow channel can be accomplished using suitable mechanical or other methods and include forming the cooling flow channel in accordance with any aspect or combination of aspects described with reference to FIGS. 1-6.

At operation 710, the method can include forming a plurality of optical metrology ports (e.g., plurality of optical metrology ports 616) configured to receive a plurality of optical metrology tubes. In some aspects, the forming of the plurality of optical metrology ports can be accomplished using suitable mechanical or other methods and may include forming the plurality of optical metrology ports in accordance with any aspect or combination of aspects described with reference to FIGS. 1-6.

Optionally, the method can include forming a first gaseous fluid chamber (e.g., showerhead flow expansion plenum 682) configured to be fluidically coupled to the plurality of showerhead flow channel outlets and the gutter purge flow channel outlet. Optionally, the method can further include forming a second gaseous fluid chamber (e.g., showerhead flow distribution plenum 680) configured to be fluidically coupled to the first gaseous fluid chamber. In some aspects, the gaseous fluid source can be configured to output gaseous fluid (e.g., H2), which can be configured to flow (i) through the first gaseous fluid chamber, then (ii) through the second gaseous fluid chamber, and finally (iii) through the plurality of showerhead flow channel outlets and the gutter purge flow channel outlet to produce a collective non-uniformity of gas flow between the plurality of first gaseous fluid flows and the second gaseous fluid flow of less than about five percent, less than about three percent, or less than about one percent.

Optionally, the method can include forming a weight relief cavity (e.g., weight relief cavity 522 of FIG. 5) configured to reduce a total mass of the CFR housing, modify a center of gravity of the CFR housing, or both. Optionally, the method can include forming a plurality of thermal metrology channels configured to support a plurality of thermal metrology devices (e.g., thermocouple-based devices). Optionally, the method can include forming a plurality of collector guide rail mounting structures (e.g., plurality of collector guide rail mounting structures 540) configured to attach to a plurality of collector guide rails (e.g., plurality of collector guide rails 542). Optionally, the method can include forming the CFR housing of Al. Optionally, the method can further include forming a coating of at least one material selected from the group consisting of TiN, Sn, or Ni.

Example EUV Radiation Source Having a CFR Housing

In some aspects, the present disclosure provides for an EUV radiation source (e.g., radiation source SO) that includes a laser source (e.g., laser system 401) configured to generate optical pulses (e.g., one or more laser beams 402) that are configured to illuminate a fuel material (e.g., one or more of the fuel targets 403') at an irradiation location (e.g., plasma formation region 404) at which the illuminated fuel material is configured to generate a plasma (e.g., plasma 407) that is configured to emit EUV radiation.

The EUV radiation source can further include a fuel source (e.g., fuel target generator 403) configured to deliver the fuel material to the irradiation location.

The EUV radiation source can further include a CFR housing (e.g., CFR housing 502, 602). The CFR housing can include a plurality of showerhead flow channel outlets (e.g., plurality of showerhead flow channel outlets 604) configured to output a plurality of first gaseous fluid flows over a plurality of portions of a plasma-facing surface (e.g., plasma-facing surface 602a) of the CFR housing. The CFR housing can further include a gutter purge flow channel outlet (e.g., gutter purge flow channel outlet 606) configured to output a second gaseous fluid flow over a fuel debris-receiving surface (e.g., fuel debris-receiving surface 602b) of the CFR housing. The CFR housing can further include a shroud mounting structure configured to support a shroud assembly (e.g., shroud assembly 520). The CFR housing can further include a cooling flow channel (e.g., cooling flow channels 612) configured to transport a liquid fluid configured to remove heat from at least a portion of the CFR housing during an EUV radiation generation operation of the EUV radiation system. The CFR housing can further include a plurality of optical metrology ports (e.g., plurality of optical metrology ports 616) configured to receive a plurality of optical metrology tubes (e.g., plurality of optical metrology tubes 618). In some aspects, the CFR housing can further include a weight relief cavity (e.g., weight relief cavity 522) configured to reduce a total mass of the CFR housing and modify a center of gravity of the CFR housing. In some aspects, the CFR housing can further include a plurality of collector guide rail mounting structures (e.g., plurality of collector guide rail mounting structures 540) configured to attach to a plurality of collector guide rails (e.g., plurality of collector guide rails 542).

In some aspects, the plurality of showerhead flow channel outlets can be configured to be fluidically coupled to a gaseous fluid chamber (e.g., showerhead flow distribution plenum 680, showerhead flow expansion plenum 682) that is configured to be fluidically coupled to the gaseous fluid source. In some aspects, the gutter purge flow channel is configured to be fluidically coupled to the gaseous fluid chamber. In some aspects, the EUV radiation source can include the third control signal being configured to instruct the gaseous fluid source to control a third gaseous fluid flow through the gaseous fluid chamber. In some aspects, the third gaseous fluid flow through the gaseous fluid chamber can be configured to produce a collective non-uniformity of gaseous fluid flow between the plurality of first gaseous fluid flows and the second gaseous fluid flow of less than about five percent.

In some aspects, the plurality of showerhead flow channel outlets, the gutter purge flow channel outlet, and the plurality of optical metrology ports are disposed on a main body (e.g., a single piece of material) of the collector flow ring housing. In some aspects, the weight relief cavity 522 of FIG. 5 is also formed in the main body, e.g., single piece of material. In some aspects, the collector flow ring housing can include aluminum (Al). In some aspects, the collector flow ring housing can include a coating of at least one material selected from the group consisting of titanium nitride (TiN), tin (Sn), or nickel (Ni).

The EUV radiation source can further include a controller (e.g., controller 411) configured to generate a first control signal configured to instruct the laser source to generate the optical pulses. The controller can be further configured to generate a second control signal configured to instruct the fuel source to deliver the fuel material. The controller can be further configured to generate a third control signal configured to instruct a gaseous fluid source (e.g., gas supply 524, 628) to control the output of the plurality of first gaseous fluid flows from the plurality of showerhead flow channel outlets. The third control signal can be further configured to instruct the gaseous fluid source to control the output of the second gaseous fluid flow from the gutter purge flow channel outlet. The controller can be further configured to generate a fourth control signal configured to instruct a liquid fluid source (e.g., cooling fluid supply 506) to control the transport of the liquid fluid in the cooling flow channel.

The EUV radiation source can further include a plurality of thermal metrology devices (e.g., thermocouple-based devices) configured to generate a plurality of thermal measurement signals associated with the CFR housing and transmit the plurality of thermal measurement signals to the controller. The CFR housing can further include a plurality of thermal metrology channels configured to support the plurality of thermal metrology devices. The controller can be further configured to receive the plurality of thermal measurement signals from the plurality of thermal metrology devices and generate a plurality of thermal measurement values (e.g., temperature values, temperature gradients, heat fluxes, and other suitable values) associated with the CFR housing based on the received plurality of thermal measurement signals.

Although specific reference may be made in this text to the use of lithographic apparatus in the manufacture of ICs, it should be understood that the lithographic apparatuses described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself can be patterned and materials added on top of it can also be patterned, or can remain without patterning.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

Implementations of the disclosure may further be described using the following clauses:

1. A collector flow ring housing configured to mitigate an accumulation of fuel debris in an extreme ultraviolet (EUV) radiation system, the collector flow ring housing comprising:

a plurality of showerhead flow channel outlets configured to output a plurality of first gaseous fluid flows over a plurality of portions of a plasma-facing surface of the collector flow ring housing; a gutter purge flow channel outlet configured to output a second gaseous fluid flow over a fuel debris-receiving surface of the collector flow ring housing;

a shroud mounting structure configured to support a shroud assembly;

a cooling flow channel configured to transport a fluid configured to remove heat from at least a portion of the collector flow ring housing during an EUV radiation generation operation of the EUV radiation system; and a plurality of optical metrology ports configured to receive a plurality of optical metrology tubes.

2. The collector flow ring housing of clause 1, wherein:

the plurality of showerhead flow channel outlets are configured to be fluidically coupled to a gaseous fluid chamber;

the gutter purge flow channel is configured to be fluidically coupled to the gaseous fluid chamber; and the gaseous fluid chamber is configured to produce a collective non-uniformity of gaseous fluid flow between the plurality of first gaseous fluid flows and the second gaseous fluid flow of less than about five percent.

3. The collector flow ring housing of clause 1, wherein the plurality of showerhead flow channel outlets, the gutter purge flow channel outlet, and the plurality of optical metrology ports are disposed in a single piece of material that forms a main body of the collector flow ring housing.

4. The collector flow ring housing of clause 3, further comprising a weight relief cavity formed in the main body of the collector flow ring housing and configured to:
reduce a total mass of the collector flow ring housing; and
modify a center of gravity of the collector flow ring housing.
5. The collector flow ring housing of clause 1, further comprising a plurality of thermal metrology channels configured to support a plurality of thermal metrology devices.
6. The collector flow ring housing of clause 1, further comprising a plurality of collector guide rail mounting structures configured to attach to a plurality of collector guide rails.
7. The collector flow ring housing of clause 1, wherein the collector flow ring housing comprises aluminum (Al).
8. The collector flow ring housing of clause 1, further comprising a coating of at least one material selected from the group consisting of titanium nitride (TiN), tin (Sn), and nickel (Ni).
9. An extreme ultraviolet (EUV) radiation source comprising:
a laser source configured to generate optical pulses that are configured to irradiate a fuel material at an irradiation location at which the irradiated fuel material is configured to generate a plasma that emits EUV radiation;
a fuel source configured to deliver the fuel material to the irradiation location;
a collector flow ring housing comprising
a plurality of showerhead flow channel outlets configured to output a plurality of first gaseous fluid flows over a plurality of portions of a plasma-facing surface of the collector flow ring housing,
a gutter purge flow channel outlet configured to output a second gaseous fluid flow over a fuel debris-receiving surface of the collector flow ring housing,
a shroud mounting structure configured to support a shroud assembly, and
a cooling flow channel configured to transport a liquid fluid configured to remove heat from at least a portion of the collector flow ring housing during an EUV radiation generation operation of the EUV radiation system.
10. The EUV radiation source of clause 9, further comprising:
a plurality of optical metrology ports configured to receive a plurality of optical metrology tubes; and
a controller configured to
generate a first control signal configured to instruct the laser source to generate the optical pulses,
generate a second control signal configured to instruct the fuel source to deliver the fuel material, generate a third control signal configured to instruct a gaseous fluid source to control the output of the plurality of first gaseous fluid flows from the plurality of showerhead flow channel outlets, wherein
the third control signal is further configured to instruct the gaseous fluid source to control the output of the second gaseous fluid flow from the gutter purge flow channel outlet, and
generate a fourth control signal configured to instruct a liquid fluid source to control the transport of the liquid fluid in the cooling flow channel.

11. The EUV radiation source of clause 10, wherein:
the plurality of showerhead flow channel outlets are configured to be fluidically coupled to a gaseous fluid chamber that is configured to be fluidically coupled to the gaseous fluid source;
the gutter purge flow channel is configured to be fluidically coupled to the gaseous fluid chamber;
the third control signal is configured to instruct the gaseous fluid source to control a third gaseous fluid flow through the gaseous fluid chamber;
the third gaseous fluid flow through the gaseous fluid chamber is configured to produce a collective non-uniformity of gaseous fluid flow between the plurality of first gaseous fluid flows and the second gaseous fluid flow of less than about five percent.
12. The EUV radiation source of clause 10, wherein the plurality of showerhead flow channel outlets, the gutter purge flow channel outlet, and the plurality of optical metrology ports are disposed in a single piece of material that forms a main body of the collector flow ring housing.
13. The EUV radiation source of clause 12, wherein the collector flow ring housing further comprises a weight relief cavity formed in the main body of the collector flow ring housing and configured to:
reduce a total mass of the collector flow ring housing; and
modify a center of gravity of the collector flow ring housing.
14. The EUV radiation source of clause 10, further comprising a plurality of thermal metrology devices configured to generate a plurality of thermal measurement signals associated with the collector flow ring housing and transmit the plurality of thermal measurement signals to the controller,
wherein the collector flow ring housing further comprises a plurality of thermal metrology channels configured to support the plurality of thermal metrology devices, and
wherein the controller is further configured to receive the plurality of thermal measurement signals from the plurality of thermal metrology devices and generate a plurality of thermal measurement values associated with the collector flow ring housing based on the received plurality of thermal measurement signals.
15. The EUV radiation source of clause 10, wherein the collector flow ring housing further comprises a plurality of collector guide rail mounting structures configured to attach to a plurality of collector guide rails.
16. A method for manufacturing a collector flow ring housing configured to mitigate an accumulation of fuel debris in an extreme ultraviolet (EUV) radiation system, the method comprising:
forming, in a main body of the collector flow ring housing, a plurality of showerhead flow channel outlets configured to output a plurality of first gaseous fluid flows over a plurality of portions of a plasma-facing surface of the collector flow ring housing;
forming, in the main body of the collector flow ring housing, a gutter purge flow channel outlet configured to output a second gaseous fluid flow over a fuel debris-receiving surface of the collector flow ring housing;
forming a shroud mounting structure configured to support a shroud assembly;
forming a cooling flow channel configured to transport a fluid configured to remove heat from at least a portion of the collector flow ring housing during an EUV radiation generation operation of the EUV radiation system; and
forming, in the main body of the collector flow ring housing, a plurality of optical metrology ports configured to receive a plurality of optical metrology tubes.

17. The method of clause 16, further comprising:
providing a first gaseous fluid chamber configured to be fluidically coupled to the plurality of showerhead flow channel outlets and the gutter purge flow channel outlet; and
providing a second gaseous fluid chamber configured to be fluidically coupled to the first gaseous fluid chamber, wherein
the first gaseous fluid chamber and the second gaseous fluid chamber are configured to produce a collective non-uniformity of gas flow between the plurality of first gaseous fluid flows and the second gaseous fluid flow of less than about five percent.
18. The method of clause 16, further comprising forming a weight relief cavity in the main body of the collector flow ring housing, the weight relief cavity configured to:
reduce a total mass of the collector flow ring housing; and
modify a center of gravity of the collector flow ring housing.
19. The method of clause 16, further comprising forming a plurality of thermal metrology channels configured to support a plurality of thermal metrology devices.
20. The method of clause 16, further comprising forming a plurality of collector guide rail mounting structures configured to attach to a plurality of collector guide rails and wherein the collector flow ring housing is formed of aluminum (Al).

The breadth and scope of the present disclosure should not be limited by any of the above-described example aspects or embodiments, but should be defined only in accordance with the following claims and their equivalents.

The invention claimed is:

1. A collector flow ring housing configured to mitigate an accumulation of fuel debris in an extreme ultraviolet (EUV) radiation system, the collector flow ring housing comprising:
   a plurality of showerhead flow channel outlets configured to output a plurality of first gaseous fluid flows over a plurality of portions of a plasma-facing surface of the collector flow ring housing;
   a gutter purge flow channel outlet configured to output a second gaseous fluid flow over a fuel debris-receiving surface of the collector flow ring housing;
   a shroud mounting structure configured to support a shroud assembly;
   a cooling flow channel configured to transport a fluid configured to remove heat from at least a portion of the collector flow ring housing during an EUV radiation generation operation of the EUV radiation system; and
   a plurality of optical metrology ports configured to receive a plurality of optical metrology tubes.

2. The collector flow ring housing of claim 1, wherein:
   the plurality of showerhead flow channel outlets are configured to be fluidically coupled to a gaseous fluid chamber;
   the gutter purge flow channel is configured to be fluidically coupled to the gaseous fluid chamber; and
   the gaseous fluid chamber is configured to produce a collective non-uniformity of gaseous fluid flow between the plurality of first gaseous fluid flows and the second gaseous fluid flow of less than about five percent.

3. The collector flow ring housing of claim 1, wherein the plurality of showerhead flow channel outlets, the gutter purge flow channel outlet, and the plurality of optical metrology ports are disposed in a single piece of material that forms a main body of the collector flow ring housing.

4. The collector flow ring housing of claim 3, further comprising a weight relief cavity formed in the main body of the collector flow ring housing and configured to:
   reduce a total mass of the collector flow ring housing; and
   modify a center of gravity of the collector flow ring housing.

5. The collector flow ring housing of claim 1, further comprising a plurality of thermal metrology channels configured to support a plurality of thermal metrology devices.

6. The collector flow ring housing of claim 1, further comprising a plurality of collector guide rail mounting structures configured to attach to a plurality of collector guide rails.

7. The collector flow ring housing of claim 1, wherein the collector flow ring housing comprises aluminum (Al).

8. The collector flow ring housing of claim 1, further comprising a coating of at least one material selected from the group consisting of titanium nitride (TiN), tin (Sn), and nickel (Ni).

9. An extreme ultraviolet (EUV) radiation source comprising:
   a laser source configured to generate optical pulses that are configured to irradiate a fuel material at an irradiation location at which the irradiated fuel material is configured to generate a plasma that emits EUV radiation;
   a fuel source configured to deliver the fuel material to the irradiation location;
   a collector flow ring housing comprising
   a plurality of showerhead flow channel outlets configured to output a plurality of first gaseous fluid flows over a plurality of portions of a plasma-facing surface of the collector flow ring housing,
   a gutter purge flow channel outlet configured to output a second gaseous fluid flow over a fuel debris-receiving surface of the collector flow ring housing,
   a shroud mounting structure configured to support a shroud assembly, and
   a cooling flow channel configured to transport a liquid fluid configured to remove heat from at least a portion of the collector flow ring housing during an EUV radiation generation operation of the EUV radiation system.

10. The EUV radiation source of claim 9, further comprising:
    a plurality of optical metrology ports configured to receive a plurality of optical metrology tubes; and
    a controller configured to
    generate a first control signal configured to instruct the laser source to generate the optical pulses,
    generate a second control signal configured to instruct the fuel source to deliver the fuel material,
    generate a third control signal configured to instruct a gaseous fluid source to control the output of the plurality of first gaseous fluid flows from the plurality of showerhead flow channel outlets, wherein the third control signal is further configured to instruct the gaseous fluid source to control the output of the second gaseous fluid flow from the gutter purge flow channel outlet, and
    generate a fourth control signal configured to instruct a liquid fluid source to control the transport of the liquid fluid in the cooling flow channel.

11. The EUV radiation source of claim 10, wherein:
the plurality of showerhead flow channel outlets are configured to be fluidically coupled to a gaseous fluid chamber that is configured to be fluidically coupled to the gaseous fluid source;
the gutter purge flow channel is configured to be fluidically coupled to the gaseous fluid chamber;
the third control signal is configured to instruct the gaseous fluid source to control a third gaseous fluid flow through the gaseous fluid chamber;
the third gaseous fluid flow through the gaseous fluid chamber is configured to produce a collective non-uniformity of gaseous fluid flow between the plurality of first gaseous fluid flows and the second gaseous fluid flow of less than about five percent.

12. The EUV radiation source of claim 10, wherein the plurality of showerhead flow channel outlets, the gutter purge flow channel outlet, and the plurality of optical metrology ports are disposed in a single piece of material that forms a main body of the collector flow ring housing.

13. The EUV radiation source of claim 12, wherein the collector flow ring housing further comprises a weight relief cavity formed in the main body of the collector flow ring housing and configured to:
reduce a total mass of the collector flow ring housing; and
modify a center of gravity of the collector flow ring housing.

14. The EUV radiation source of claim 10, further comprising a plurality of thermal metrology devices configured to generate a plurality of thermal measurement signals associated with the collector flow ring housing and transmit the plurality of thermal measurement signals to the controller,
wherein the collector flow ring housing further comprises a plurality of thermal metrology channels configured to support the plurality of thermal metrology devices, and
wherein the controller is further configured to receive the plurality of thermal measurement signals from the plurality of thermal metrology devices and generate a plurality of thermal measurement values associated with the collector flow ring housing based on the received plurality of thermal measurement signals.

15. The EUV radiation source of claim 10, wherein the collector flow ring housing further comprises a plurality of collector guide rail mounting structures configured to attach to a plurality of collector guide rails.

16. A method for manufacturing a collector flow ring housing configured to mitigate an accumulation of fuel debris in an extreme ultraviolet (EUV) radiation system, the method comprising:
forming, in a main body of the collector flow ring housing, a plurality of showerhead flow channel outlets configured to output a plurality of first gaseous fluid flows over a plurality of portions of a plasma-facing surface of the collector flow ring housing;
forming, in the main body of the collector flow ring housing, a gutter purge flow channel outlet configured to output a second gaseous fluid flow over a fuel debris-receiving surface of the collector flow ring housing;
forming a shroud mounting structure configured to support a shroud assembly;
forming a cooling flow channel configured to transport a fluid configured to remove heat from at least a portion of the collector flow ring housing during an EUV radiation generation operation of the EUV radiation system; and
forming, in the main body of the collector flow ring housing, a plurality of optical metrology ports configured to receive a plurality of optical metrology tubes.

17. The method of claim 16, further comprising:
providing a first gaseous fluid chamber configured to be fluidically coupled to the plurality of showerhead flow channel outlets and the gutter purge flow channel outlet; and
providing a second gaseous fluid chamber configured to be fluidically coupled to the first gaseous fluid chamber, wherein
the first gaseous fluid chamber and the second gaseous fluid chamber are configured to produce a collective non-uniformity of gas flow between the plurality of first gaseous fluid flows and the second gaseous fluid flow of less than about five percent.

18. The method of claim 16, further comprising forming a weight relief cavity in the main body of the collector flow ring housing, the weight relief cavity configured to:
reduce a total mass of the collector flow ring housing; and
modify a center of gravity of the collector flow ring housing.

19. The method of claim 16, further comprising forming a plurality of thermal metrology channels configured to support a plurality of thermal metrology devices.

20. The method of claim 16, further comprising forming a plurality of collector guide rail mounting structures configured to attach to a plurality of collector guide rails and wherein the collector flow ring housing is formed of aluminum (Al).

* * * * *